United States Patent
Zoellin et al.

(10) Patent No.: US 9,143,849 B2
(45) Date of Patent: Sep. 22, 2015

(54) SENSOR MODULE

(71) Applicants: Jochen Zoellin, Muellheim (DE); Ricardo Ehrenpfordt, Korntal-Muenchingen (DE)

(72) Inventors: Jochen Zoellin, Muellheim (DE); Ricardo Ehrenpfordt, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 43 days.

(21) Appl. No.: 13/905,755

(22) Filed: May 30, 2013

(65) Prior Publication Data
US 2013/0322675 A1 Dec. 5, 2013

(30) Foreign Application Priority Data

May 31, 2012 (DE) .......................... 10 2012 209 235

(51) Int. Cl.

| | |
|---|---|
| H04R 9/08 | (2006.01) |
| H04R 11/04 | (2006.01) |
| H04R 17/02 | (2006.01) |
| H04R 19/04 | (2006.01) |
| H04R 21/02 | (2006.01) |
| H04R 1/04 | (2006.01) |
| H04R 19/00 | (2006.01) |
| H04R 1/08 | (2006.01) |
| H04R 31/00 | (2006.01) |

(52) U.S. Cl.
CPC ................ *H04R 1/04* (2013.01); *H04R 19/005* (2013.01); *H04R 19/04* (2013.01); *H04R 1/08* (2013.01); *H04R 1/083* (2013.01); *H04R 1/086* (2013.01); *H04R 9/08* (2013.01); *H04R 11/04* (2013.01); *H04R 17/02* (2013.01); *H04R 21/02* (2013.01); *H04R 31/00* (2013.01)

(58) Field of Classification Search
CPC ............ H04R 1/08; H04R 1/083; H04R 9/08; H04R 11/04; H04R 17/02; H04R 21/02; H04R 1/04; H04R 19/04; H04R 19/005; H04R 1/086; H04R 31/00
USPC ........................................... 381/355; 257/416
See application file for complete search history.

(56) References Cited

U.S. PATENT DOCUMENTS

| | | | | |
|---|---|---|---|---|
| 8,290,184 | B2 * | 10/2012 | Yueh .............................. | 381/174 |
| 2008/0267431 | A1 * | 10/2008 | Leidl et al. .................... | 381/173 |
| 2010/0284553 | A1 * | 11/2010 | Conti et al. ................... | 381/174 |
| 2012/0181639 | A1 * | 7/2012 | Ehrenpfordt et al. ......... | 257/416 |
| 2012/0212925 | A1 * | 8/2012 | Zoellin et al. ................. | 361/807 |

* cited by examiner

*Primary Examiner* — Matthew Eason
*Assistant Examiner* — Sean H Nguyen
(74) *Attorney, Agent, or Firm* — Kenyon & Kenyon LLP

(57) ABSTRACT

A cost-effective and extremely space-saving module approach is provided for at least two micromechanical sensor elements having the same packaging requirements. The sensor module described here includes at least two micromechanical sensor elements whose sensor function is based on the direct or indirect impact of a measuring medium. The at least two sensor elements are situated in a shared housing having at least one access opening for the measuring medium, and the at least two sensor elements are stacked with one component back side on one component front side, so that the upper sensor element at least partially covers the active area of the lower sensor element, while still ensuring the impact of the measuring medium, which is used for the sensor function, on the active area of the lower sensor element.

10 Claims, 3 Drawing Sheets

SENSOR MODULE

FIELD OF THE INVENTION

The present invention relates to a sensor module having at least two micromechanical sensor elements whose sensor function is based on the direct or indirect impact of a measuring medium.

BACKGROUND INFORMATION

The pressure measurement and the microphone function are important examples of micromechanically implementable sensor functions which are based on the impact of a measuring medium. These sensor functions are becoming more and more important, in particular in the field of consumer applications, such as mobile phones, smart phones, navigation devices, MP3 players, video game consoles, and digital cameras. With the aid of pressure sensors, changes in the air pressure may be detected in order to in this way obtain climate information or altitude information for a navigation device, for example. Microphones are used here for speech detection and background noise reduction.

Microphone components are known from practice which have a micromechanical microphone component and a carrier- or substrate-based housing having a sound opening. The microphone chip is in this case installed on a carrier with the aid of chip-on-board (COB) technology, electrically contacted, and covered by a cover or a molding compound. When the micromechanical microphone structure is implemented on an MEMS component and the signal analysis is implemented entirely or partially on a separate ASIC component, the chips are in general situated next to one another on the carrier, so that the surface area requirement of the known components is relatively large in relation to the surface area of the MEMS chip.

SUMMARY

The present invention proposes a cost-effective and extremely space-saving module approach for at least two micromechanical sensor elements having the same packaging requirements.

According to the present invention, the at least two sensor elements are situated for this purpose in a shared housing having at least one access opening for the measuring medium, and one component back side is stacked on one component front side, so that the upper sensor element at least partially covers the active area of the lower sensor element, while still ensuring the impact of the measuring medium, which is necessary for the sensor function, on the active area of the lower sensor element.

Initially, it was recognized that sensor elements whose sensor functions are each based on the impact of a measuring medium may be situated very easily in a shared housing if this housing is equipped with at least one access opening as the medium access. This alone allows the packaging complexity for the sensor elements to be significantly reduced overall. The packaging concept according to the present invention also provides a stacked arrangement of the two MEMS sensor elements, thus deviating from the side-by-side chip arrangement known from the related art. It was recognized according to the present invention that a stacked arrangement does not necessarily have a negative effect on the sensor functions, but may rather even have a certain protective effect against environmental influences if a suitable assembly technique is used. Moreover, the stacked arrangement of the sensor elements allows for a minimization of the lateral dimensions of the sensor module, so that the space requirement of the sensor module is comparatively small in the 2nd-level assembly. This ultimately also contributes to a reduction of the manufacturing costs for the completed devices.

Overall, the packaging concept according to the present invention offers a very high flexibility, when it comes to the combination of sensor functions and the arrangement of sensor elements in the component stack, and also when it comes to the type, shape, and material of the housing as well as the implementation of the medium access. The micromechanical sensor elements may be equipped with only one or also with multiple sensor functions. In addition to the already mentioned sensor functions of pressure detection and microphone function, the detection of light, gas, humidity, temperature, and fluid flows should also be mentioned here, as an example.

In the consumer electronics field, the combination of sensor elements with pressure-sensitive diaphragm structures is of particular economic importance, namely in particular the combination of a microphone component and a pressure sensor element for detecting the static pressure. The diaphragm structure of the microphone component in general spans a cavern in the component back side which then forms the back side volume or the front volume of the microphone component, depending on the assembly of the microphone component.

In one first configuration variant of a sensor module according to the present invention having a pressure sensor and a microphone component, the microphone component is situated within the housing and the component stack in such a way that the back-side cavern is closed off due to assembly and functions as the back-side volume for the microphone component, while the sound pressure application takes place via the front side of the component.

In one particularly advantageous specific embodiment of this first configuration variant, the fact is exploited that the diaphragm structure of the microphone component is primarily sensitive to sound pressure, i.e., to rapid pressure fluctuations, while it is permeable to low-frequency pressure changes below a designated limiting frequency. In this specific embodiment, the microphone component is installed above the diaphragm structure of the pressure sensor component. The static pressure is transferred in this case via the diaphragm structure and the cavern of the microphone component to the diaphragm structure of the pressure sensor element, so that the pressure application of the diaphragm structure of the pressure sensor component thus takes place indirectly in this case. In this arrangement of the sensor elements, the microphone component forms a type of cover for the front side of the pressure sensor element, where the diaphragm structure and, if necessary, also the switching functions are implemented. These sensitive components of the pressure sensor element are sufficiently protected in this way against adverse effects of the measuring medium.

In one alternative specific embodiment of the first configuration variant, the pressure sensor element is installed above the diaphragm structure of the microphone component. Since the pressure sensor element is in general not permeable to sound waves, at least one pressure contact is implemented on the microphone component for the sound pressure application of the diaphragm structure of the microphone component during the assembly of the pressure sensor element. In addition, the pressure sensor element may, for example, be installed on the microphone component via a standoff structure. Depending on the connection method, such a standoff structure may be implemented in the form of a structured connecting layer, for example.

In one second configuration variant of a sensor module according to the present invention having a pressure sensor element and a microphone component, the microphone component is installed within the housing and, in particular, above an access opening of the housing in such a way that the sound pressure application of the diaphragm structure takes place via the back-side cavern. The back-side cavern forms in this case the front volume of the microphone component. Advantageously, the pressure sensor element is installed above the diaphragm structure of the microphone component in such a way that there is a pressure connection between the front side of the microphone component and the housing interior. Thereby, the entire housing interior may be used as the back-side volume for the microphone component, which has a positive effect on the sensitivity, the signal-to-noise ratio, and also on the frequency range of the microphone function. Since, as already mentioned, the microphone component is permeable to low-frequency pressure changes, the static pressure is transferred indirectly, also in this case, via the diaphragm structure of the microphone component and the housing interior, to the diaphragm structure of the pressure sensor element. In this configuration variant, the pressure sensor element additionally fulfills a protective function for the front side of the microphone component having the diaphragm structure and, if necessary, the integrated switching functions.

The sensor modules of the type discussed here usually also include analysis electronics for the sensor signals. In the case of a sensor module according to the present invention, there are different possibilities for positioning such analysis electronics. To decouple the different sensor functions, it may be reasonable to equip each sensor element with its own analysis electronics or at least with parts of such analysis electronics. In the case of identical or similar sensor functions, the use of shared analysis electronics suggests itself. These analysis electronics may then be integrated on one of the sensor elements of the sensor module, for example. From the manufacturing point of view, those integrated hybrid approaches prove themselves particularly advantageous in which the micromechanical sensor function and the associated analysis electronics are implemented on separate components. In this case, the analysis electronics for all sensor elements of the sensor module may be simply integrated on one ASIC component. In most cases, sensor elements having different sensor functions also have different analysis cycles, so that the different sensor signals are analyzed sequentially using an identical circuit or using parts of an identical circuit. In general, a possibly necessary balancing circuit may also be used for multiple sensor elements.

Basically, there are various possibilities for positioning an ASIC component having analysis electronics within the housing of the sensor module. For example, such an ASIC component may be situated next to the component stack having the sensor elements and be installed face-up or also face-down on the housing inside wall. The electrical connection between the sensor elements and the ASIC component may then be optionally established on the housing inside wall via wire bonds and/or via printed conductors. In one particularly advantageous, since space-saving, specific embodiment of the present invention, the ASIC component is situated below or above the stacked sensor elements, i.e., within the component stack. The face-up or face-down orientation of the ASIC component is in this case a function of both its position within the component stack and the electrical contacting of the sensor elements.

As mentioned previously, there is a lot of room for design flexibility when it comes to implementing the housing of a sensor module according to the present invention as long as it is equipped with at least one access opening as the medium access. With regard to a simple integrated circuit packaging, it is advantageous if the housing includes a carrier on which the component stack and, if necessary, also other components are installed. Such a housing furthermore includes at least one cover part and/or one cover structure which is/are situated above the component stack and is/are connected at least to the carrier. Access openings may in this case be formed in both the carrier and in the cover part or in the cover structure. The arrangement of the at least one access opening in any case primarily depends on the sensor functions and the installation site of the sensor module.

Here, it is to be explicitly pointed out that the packaging concept according to the present invention is very well suitable for the first level packaging of MEMS microphone components in combination with MEMS pressure sensor elements, but is not limited to this application and may also include more than two micromechanical sensor elements.

DETAILED DESCRIPTION

Figure 1:
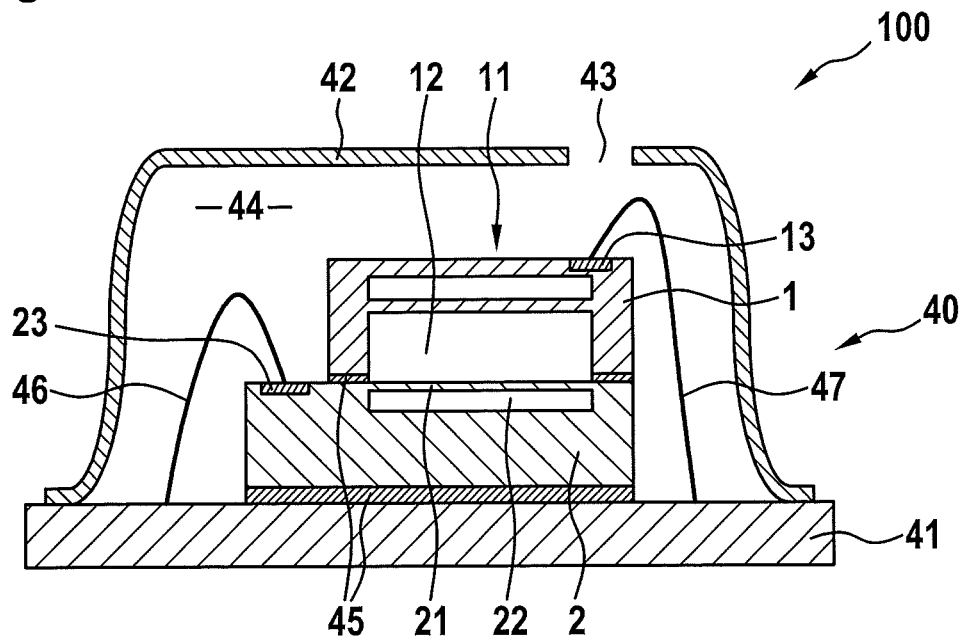
FIG. 1 shows a schematic sectional view of a first sensor module 100 according to the present invention having a microphone component and a pressure sensor element, the microphone component being situated on the pressure sensor element.

All exemplary embodiments described in the following refer to a sensor module having a microphone component 1 and a pressure sensor element 2 as the micromechanical sensor elements whose sensor functions are based on the direct or indirect impact of a measuring medium.

In the front side of microphone component 1, a diaphragm structure 11 is formed having an arrangement for signal detection which are contacted on the front side of microphone component 1 via connecting pads 13. Diaphragm structure 11 spans a cavern 12 in the component back side and is sensitive to sound pressure, while it is permeable to pressure changes having low frequencies, so-called static pressure changes.

Diaphragm structure 21 of pressure sensor element 2 is also formed in the component front side and is equipped with an arrangement for signal detection which are contacted via connecting pads 23 in the component front side. Diaphragm structure 21 spans a cavity 22 in the substrate of pressure sensor element 2 which is closed off on the back side. This diaphragm structure is used to detect the static ambient pressure.

Microphone component 1 and pressure sensor element 2 are each stacked with one component back side on one component front side, so that the upper sensor element at least partially covers the active area of the lower sensor element, while still ensuring the impact of the measuring medium, which is necessary for the sensor function, on the active area of the lower sensor element. This aspect of the present invention is explained again in the following separately for each exemplary embodiment.

In all exemplary embodiments described in the following, the component stack is situated in a housing 40 which includes a carrier 41 and a cover part 42 and which is equipped with a medium access in the form of at least one access opening 43 to housing interior 44. In each case, the component stack is installed on carrier 41 which is preferably provided with at least one conductive structured layer for electrical contacting and shielding. This may, for example, be a printed board substrate in the form of a multi-panel substrate. Cover part 42 is situated above the component stack and circumferentially connected to carrier 41 so that it delimits housing interior 44 and forms a mechanical protection for the components situated there. Cover part 42 may be provided with a conductive layer for electrically shielding housing interior 44.

The overall height of such a sensor module may be reduced by using thinned sensor components.

For electrically contacting the individual components of the sensor module according to the present invention, the connecting layers between the individual sensor elements of the component stack as well as the connecting layer to the carrier may be designed to be at least sectionally conductive.

In the case of sensor module 100 illustrated in FIG. 1, pressure sensor element 2 is installed with its back side on carrier 41 via a connecting layer 45 and thereby forms the lower sensor element of the component stack. Depending on the type of connecting layer 45, it may be used exclusively for the mechanical fastening, but also establish an electrical connection between the component and the carrier. In the exemplary embodiment illustrated here, pressure sensor element 2 is also electrically connected to carrier 41 via connecting pads 23 and bond wires 46. According to the present invention, microphone component 1 is installed with its back side on the front side of pressure sensor element 2, namely above diaphragm structure 21 which forms the active area of pressure sensor element 2. Microphone component 1 is mechanically fastened on the frame of diaphragm structure 21 of pressure sensor element 2. Accordingly, cavern 12 of microphone component 1 is closed off on its back side by diaphragm structure 21 of pressure sensor element 2. An electrical connection may also be established, if necessary, via the mechanical connection between the two components. In any case, microphone component 1 is also electrically connected to carrier 41 via connecting pads 13 and bond wires 47.

Housing 40 of sensor module 100 has only one access opening 43 which is formed in cover part 42 in this case. Alternatively or also additionally, an access opening could also be situated in the carrier next to the pressure sensor element, depending on how the sensor module is to be installed in an application and on how the measuring medium is to be supplied in this application. In any case, the sound pressure acts in the case of sensor module 100 on diaphragm structure 11 of microphone component 1 starting from the front side of the component, and entire housing interior 44 is used as the front volume. Cavern 12, which is closed off by diaphragm structure 21 of pressure sensor element 2, accordingly forms the back-side volume of microphone component 1.

In this arrangement, the measuring medium does not act directly on pressure-sensitive diaphragm structure 21 of pressure sensor element 2. The ambient pressure prevailing in housing interior 44 is transferred here to diaphragm structure 21 of pressure sensor element 2 via diaphragm structure 11 and cavern 12 of microphone component 1 and is detected there as the diaphragm deflection.

Figure 2:
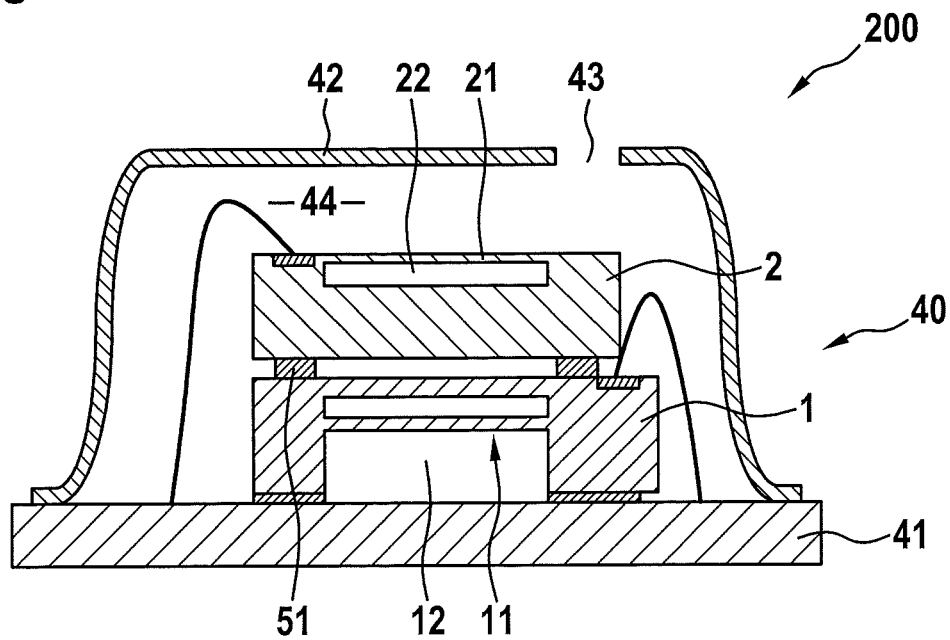
FIG. 2 shows a schematic sectional view of a second sensor module 200 according to the present invention in which the pressure sensor element is situated on the microphone component and the medium access is formed in the housing cover.

In contrast to sensor module 100, microphone component 1 is installed on carrier 41 in sensor module 200 illustrated in FIG. 2, so that back-side cavern 12 is closed off by carrier 41. According to the present invention, pressure sensor element 2 is installed with its back side on the front side of microphone component 1, namely above diaphragm structure 11 which forms the active area of microphone component 1. To ensure the sensor function of microphone component 1, pressure sensor element 2 is mechanically fastened and, if necessary, electrically connected on microphone component 1 via a connecting layer 51 in the frame area of diaphragm structure 11. This connecting layer 51 forms a standoff structure, which is not circumferentially closed, between pressure sensor element 2 and microphone component 1 and ensures that there is a pressure connection between the front side of microphone component 1 and housing interior 44. The pressure connection may be implemented in the form of one or also multiple pipe-like openings in otherwise closed connecting layer 51 or also in that connecting layer 51 only extends over a section of the frame area and pressure sensor element 2 is thus connected to microphone component 1 only in this section. This variant suggests itself in particular when the two sensor elements are offset in relation to one another or the pressure sensor element has a considerably smaller chip surface than the microphone component. In the case of this type of fastening, a fluidic area having a fluidic impedance develops in each case, through which the transfer behavior of the sensor elements may be influenced in a targeted manner, e.g., by varying the overlapping degree of the sensor elements connected in this manner. In the case of the microphone function, this may be used to set the noise, the frequency response, and the direction dependency.

As in the case of sensor module 100, housing 40 of sensor module 200 has only one access opening 43 in cover part 42. Accordingly, the ambient pressure of sensor module 200, which acts directly on diaphragm structure 21 of pressure sensor element 2, prevails in housing interior 44. Housing interior 44 moreover forms the front volume for microphone component 1, since the sound pressure acts on diaphragm structure 11 of microphone component 1 via the pressure connection to housing interior 44. Cavern 12, which is closed off by carrier 41, forms here the back-side volume of microphone component 1. In the case of sensor element 200, the measuring medium thus acts directly on both diaphragm structure 21 of pressure sensor 2 and diaphragm structure 11 of microphone component 1.

Figure 3:
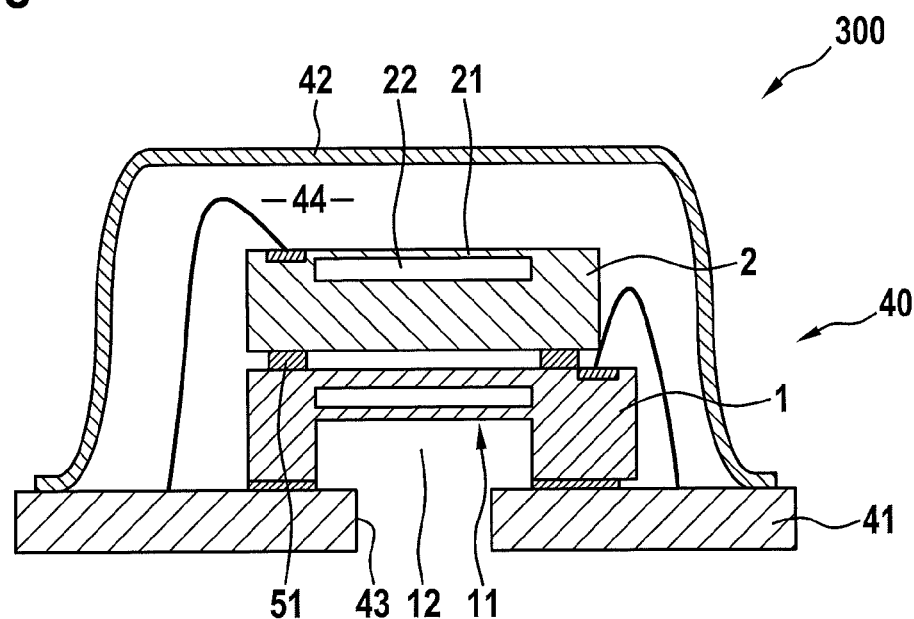
FIG. 3 shows a schematic sectional view of a third sensor module 300 according to the present invention in which the pressure sensor element is situated on the microphone component and the microphone component is installed in the carrier of the housing above the medium access.

The only difference between the configuration of sensor module 200 and sensor module 300 illustrated in FIG. 3 is the arrangement of the medium contact or access opening 43 of housing 40. In sensor module 300, access opening 43 is formed in carrier 41. Microphone component 1 is installed here on carrier 41 above access opening 43, so that the medium contact ends in back-side cavern 12 of microphone component 1. As in the case of sensor module 200, pressure sensor element 2 is installed above diaphragm structure 11 of microphone component 1, namely via a connecting layer 51 in the frame area of diaphragm structure 11 of microphone component 1, so that there is a pressure connection between the front side of microphone component 1 and housing interior 44.

In sensor module 300, the pressure application takes place via the back side of diaphragm structure 11 of microphone component 1, cavern 12 functioning as the front volume. The sound pressure is detected by microphone component 1 as a diaphragm vibration, entire housing interior 44 being used as the back-side volume. In this way, it is not only possible to increase the microphone sensitivity and to improve the signal-to-noise ratio, but the frequency range of the microphone function also increases compared to the previously described module variants. Since microphone component 1 is permeable to pressure changes below a designated limiting frequency, the static pressure applied to sensor module 300 is transferred via diaphragm structure 11 of microphone component 1 to housing interior 44 and thus to diaphragm structure 21 of pressure sensor element 2. This means that, as in the case of sensor element 100, the measuring medium does not act directly on pressure-sensitive diaphragm structure 21 of pressure sensor element 2. The ambient pressure of sensor module 300 is rather transferred indirectly to the housing interior and diaphragm structure 21 of pressure sensor element 2 via diaphragm structure 11 of microphone component 1 and is detected there as the diaphragm deflection.

Here, it is to be pointed out that in addition to access opening 43 in carrier 41 below diaphragm structure 11 of microphone component 1, other access openings may also be formed in the cover part and/or in the carrier of the housing. This proves to be particularly advantageous when the sensor module is to be connected to measuring media which are applied to both sides of the housing. In the case of the microphone function, this may be used, for example, for noise suppression, for shaping the transfer function, or for direction dependency.

Figure 4:
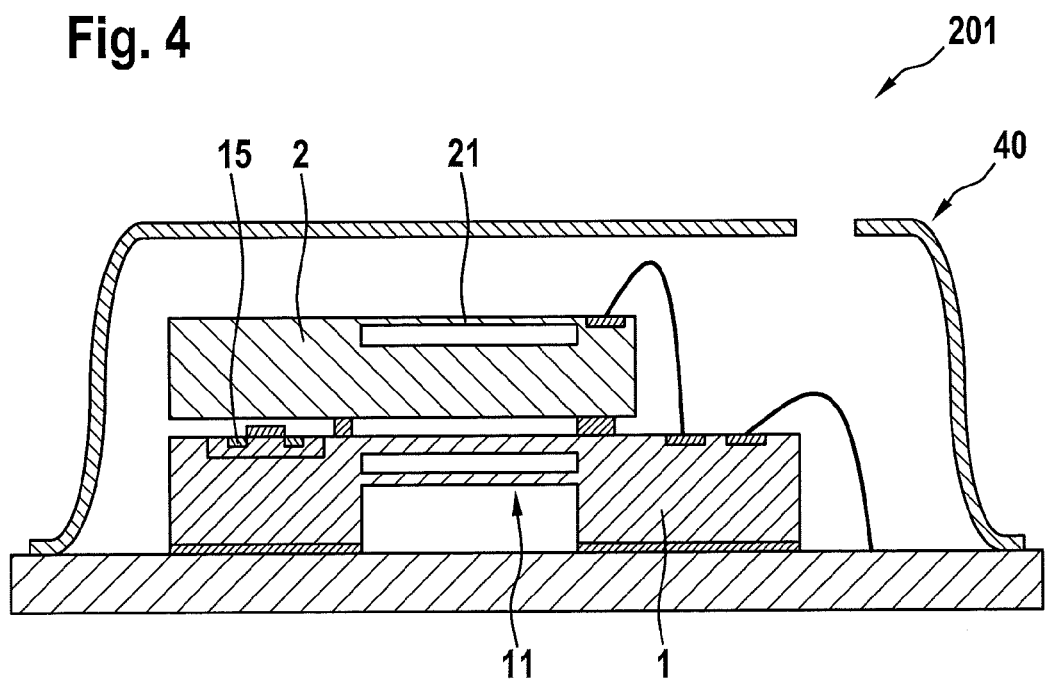
FIG. 4 shows a schematic sectional view of a fourth sensor module 201 according to the present invention in which the analysis electronics for both sensor elements are integrated on the microphone component.

A sensor module according to the present invention is in general also equipped with analysis electronics for the individual sensor elements. FIG. 4 shows one embodiment variant 201 of sensor module 200 in which shared analysis electronics 15 are integrated on microphone component 1 for both sensor elements, microphone component 1, and pressure sensor element 2. Pressure sensor element 2 is in this case installed on microphone component 1 above analysis electronics 15 and diaphragm structure 11 in such a way that it forms a mechanical protection and an electromagnetic shielding for analysis electronics 15.

Figure 5A:
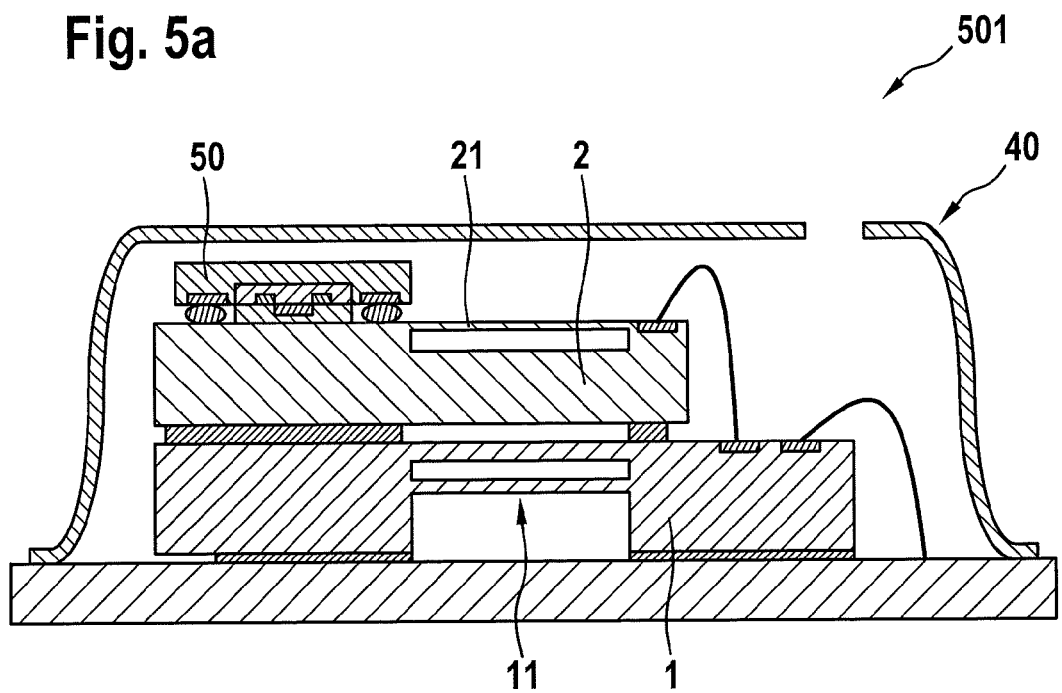
FIG. 5a shows a schematic sectional view of a sensor module 501, in which the analysis electronics for this sensor element are integrated on a separate ASIC component.
Figure 5B:
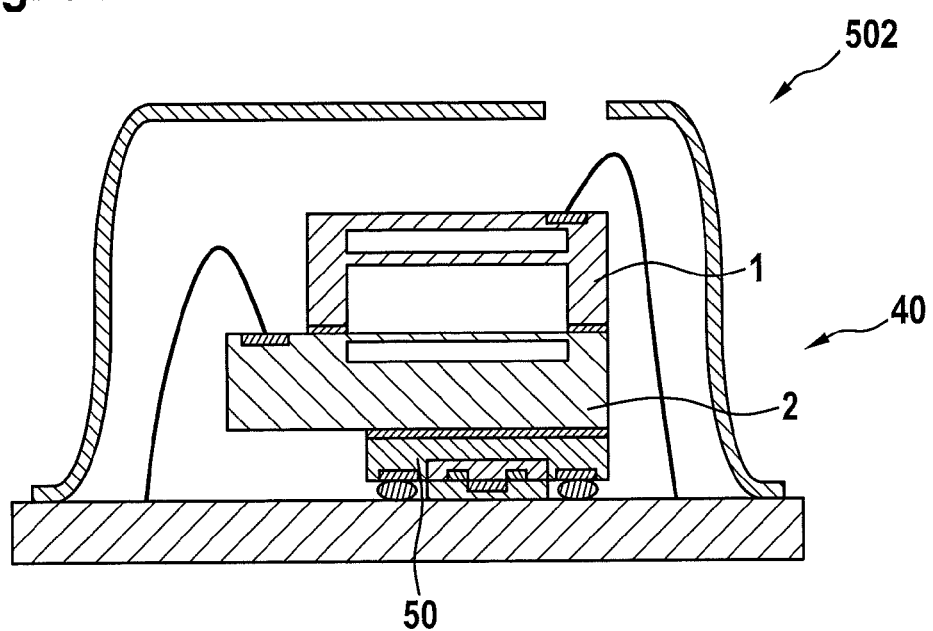
FIG. 5b shows a schematic sectional view of a sensor module 502, in which the analysis electronics for this sensor element are integrated on a separate ASIC component.

The analysis electronics for the sensor elements may, however, also be integrated on a separate ASIC component 50 which is then situated in the housing of the sensor module together with the sensor elements. In addition to a side-by-side arrangement in which the ASIC component is situated on the carrier face-up or face-down next to the component stack of the sensor elements, it is also possible to situate ASIC component 50 within the component stack. In the case of sensor module 501 illustrated in FIG. 5a, ASIC component 50 is also installed face-down, i.e., flipped, on pressure sensor element 2, the upper sensor element of the component stack. FIG. 5b shows one configuration variant in which ASIC component 50 was installed on carrier 41 using flip chip technology and the component stack, including microphone component 1 and pressure sensor element 2, was installed on the back side of ASIC component 50. With regard to the overall height of the sensor module, thinned sensor and ASIC components are preferably used in the configuration variants illustrated here. In this context, the possibilities are to be pointed out to embed one or also multiple components into the carrier and/or to design the cover part in such a way that it closes off to the uppermost or also to another component of the sensor module in a media-tight manner.

What is claimed is:

1. A sensor module, comprising:
   at least two micromechanical sensors exposed to a measuring medium, each of the at least two sensors having a sensor function based on one of a direct and an indirect impact of the measuring medium on the sensors; and
   a housing in which the at least two sensors are situated, the housing including at least one access opening for the measuring medium to be exposed to each of the at least two sensors, wherein:
   the at least two sensors are stacked in which one component back side is on one component front side, so that an upper sensor of the at least two sensors at least partially covers an active area of the lower sensor of the at least two sensors, while still ensuring the impact of the measuring medium for the sensor function on the active area of the lower sensor, and wherein:
   each of the at least two sensors includes a pressure-sensitive diaphragm structure,
   one of the at least two sensors functions as a pressure sensor, another one of the at least two sensors functions as a microphone, and
   at least the diaphragm structure of the sensor functioning as the microphone spans a cavern in a component back side.

2. The sensor module as recited in claim 1, wherein:
   the microphone is situated within the housing and the component stack in such a way that the cavern is closed off due to the assembly and functions as a back-side volume for the microphone, while a sound pressure application takes place via a front side of the microphone.

3. The sensor module as recited in claim 2, wherein:
   the microphone is installed above the diaphragm structure of the pressure sensor, and
   the sound pressure application of the pressure sensor takes place via the diaphragm structure and the cavern of the microphone.

4. The sensor module as recited in claim 2, wherein:
   the pressure sensor is installed above the diaphragm structure of the microphone, so that at least one pressure contact for the sound pressure application of the diaphragm structure of the microphone is located between the front side of the microphone and a back side of the pressure sensor.

5. The sensor module as recited in claim 1, wherein the microphone is
   installed within the housing in such a way that the sound pressure application of the diaphragm structure takes place via the cavern.

6. The sensor module as recited in claim 5, wherein the microphone is installed within and above an access opening of the housing.

7. The sensor module as recited in claim 5, wherein:
   the pressure sensor is installed above the diaphragm structure of the microphone, so that a pressure connection is established between the front side of the microphone component and an interior of the housing, and
   the interior of the housing functions as a back-side volume for the microphone.

8. The sensor module as recited in claim 1, further comprising:
   analysis electronics for the at least two sensors, wherein:
   at least parts of the analysis electronics are integrated on at least one of the at least two sensors and at least one ASIC component which is also situated within the housing.

9. The sensor module as recited in claim 1, further comprising:
at least one ASIC component on which at least parts of analysis electronics for the at least two sensors are integrated, wherein the ASIC component is an integral part of the same component stack as the at least two sensors.

10. The sensor module as recited in claim 1, wherein:
the housing includes:
a carrier on which the component stack is installed,
at least one of at least one cover part and a cover structure is connected to the carrier and surrounds the component stack, and
the at least one access opening of the housing is formed in at least one of the carrier and one of the cover part and the cover structure.

* * * * *